US008809102B2

(12) United States Patent
Shimizu et al.

(10) Patent No.: US 8,809,102 B2
(45) Date of Patent: Aug. 19, 2014

(54) SOLAR BATTERY CELL CONNECTION METHOD AND SOLAR BATTERY MODULE

(75) Inventors: Takehiro Shimizu, Tokyo (JP); Kaoru Okaniwa, Tsukuba (JP); Naoki Fukushima, Chikusei (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 922 days.

(21) Appl. No.: 12/443,064

(22) PCT Filed: Oct. 13, 2007

(86) PCT No.: PCT/JP2007/069730
§ 371 (c)(1),
(2), (4) Date: Sep. 4, 2009

(87) PCT Pub. No.: WO2008/044696
PCT Pub. Date: Apr. 17, 2008

(65) Prior Publication Data
US 2010/0116310 A1    May 13, 2010

(30) Foreign Application Priority Data

Oct. 13, 2006  (JP) ................................ P2006-279907
Apr. 27, 2007  (JP) ................................ P2007-119404
Jun. 13, 2007  (JP) ................................ P2007-156702

(51) Int. Cl.
*H01L 21/00* (2006.01)
*H01L 31/042* (2014.01)
*H01L 31/05* (2014.01)

(52) U.S. Cl.
CPC .................................. *H01L 31/0508* (2013.01)
USPC ........................................... 438/80; 136/244

(58) Field of Classification Search
CPC .................................................... H01L 31/0508
USPC ............. 136/243–265; 29/890.033, 450, 881,
29/469.5, 825, 592.1, 838, 623.4, 32, 33;
438/66, 67; 174/69, 268, 259
See application file for complete search history.

(56) References Cited

U.S. PATENT DOCUMENTS 4,336,648 A    6/1982  Pschunder et al.
4,694,117 A    9/1987  Friedrich et al.
(Continued)

FOREIGN PATENT DOCUMENTS

EP    1 484 801 A2    12/2004
JP    60107872 A  *  6/1985
(Continued)

OTHER PUBLICATIONS

"DM5130P thermost adhesive paste product data sheet", published by Diemat [Retrieved from internet at http://www.everton.com.cn/admin/file/upimg/2005815173235.pdf on Feb. 15, 2013].*

(Continued)

*Primary Examiner* — Jeffrey T Barton
*Assistant Examiner* — Eric R Smith
(74) *Attorney, Agent, or Firm* — Griffin & Szipl, P.C.

(57) ABSTRACT

A method of connecting solar battery cells, each provided with a front-face and a back-face electrode, comprises: preparing a wiring member including a strip-like conductive substrate and an adhesive layer provided on one face of the substrate, and bonding the adhesive layer on one end portion of the wiring member with the front-face electrode or the back-face electrode of one cell; turning an other end portion of the wiring member having completed the above preparation, around a central axis along a longitudinal direction so an adhesive layer surface of the other end portion is opposite in orientation to an adhesive layer surface of the one end portion; and then bonding the adhesive layer of the other end portion of the wiring member with an electrode of another solar battery cell having an opposite polarity to the electrode of the one cell previously bonded in the aforementioned preparation process.

15 Claims, 8 Drawing Sheets

(56) References Cited

U.S. PATENT DOCUMENTS

| | | | |
|---|---|---|---|
| 5,330,583 | A | 7/1994 | Asai et al. |
| 6,184,457 | B1 | 2/2001 | Tsuzuki et al. |
| 6,471,816 | B1 | 10/2002 | Shuto et al. |
| 6,676,459 | B2 * | 1/2004 | Mukai et al. ............... 439/884 |
| 7,173,188 | B2 | 2/2007 | Endo et al. |
| 2002/0197917 | A1 | 12/2002 | Mukai et al. |
| 2004/0154658 | A1 | 8/2004 | Tanaka et al. |
| 2004/0200522 | A1 * | 10/2004 | Fukawa et al. ............... 136/259 |
| 2005/0039943 | A1 | 2/2005 | Endo et al. |
| 2005/0133084 | A1 | 6/2005 | Joge et al. |
| 2007/0221270 | A1 | 9/2007 | Watsuji et al. |
| 2009/0235972 | A1 | 9/2009 | Fukushima et al. |
| 2010/0243059 | A1 | 9/2010 | Okaniwa |

FOREIGN PATENT DOCUMENTS

| | | |
|---|---|---|
| JP | 62-000579 | 1/1987 |
| JP | 62-16579 A | 1/1987 |
| JP | 11-177117 | 7/1999 |
| JP | 11-233484 A | 8/1999 |
| JP | 11-312820 | 11/1999 |
| JP | 2000-286436 A | 10/2000 |
| JP | 2001-352089 | 12/2001 |
| JP | 2001-357897 A | 12/2001 |
| JP | 3448924 A | 7/2003 |
| JP | 2004-204256 A | 7/2004 |
| JP | 2004-253475 A | 9/2004 |
| JP | 2005-050780 A | 2/2005 |
| JP | 2005-072115 | 3/2005 |
| JP | 2005-101519 A | 4/2005 |
| JP | 2005-216963 | 8/2005 |
| JP | 2005-243935 B2 | 9/2005 |
| JP | 2005-252062 | 9/2005 |
| JP | 2002-278740 A | 10/2006 |
| JP | 2007-158302 | 6/2007 |
| JP | 2007-179682 A | 7/2007 |
| JP | 2008-85469 A | 4/2008 |
| JP | 2008-120990 A | 5/2008 |
| JP | 2008-150597 A | 7/2008 |
| JP | 2008-186590 A | 8/2008 |
| JP | 2008-195904 A | 8/2008 |
| WO | 2007/125903 A1 | 11/2007 |

OTHER PUBLICATIONS

Translation of JP60-107872 by USPTO Scientific and Technical Information Center.*

Extended European Search Report issued in a counterpart European application 07829468.3 completed Sep. 14, 2011 and mailed Sep. 21, 2011.
Office Action issued in co-pending related U.S. Appl. No. 12/743,200 on May 24, 2012.
Official Action issued on Nov. 15, 2011 in related Japanese Patent Application No. 2009-541130.
International Search Report, issued in related application PCT/JP2008/070451, completed Feb. 3, 2009 and mailed Feb. 17, 2009.
Korean Office Action issued Apr. 12, 2011 with English Translation in related Application No. 10-2010-7009870.
International Search Report issued in corresponding application No. PCT/JP2007/069730, completed Dec. 25, 2007 and mailed Jan. 15, 2008.
English translation of International Preliminary Report on Patentability issued in corresponding application No. PCT/JP2007/069730, issued Apr. 22, 2009.
Notice of Allowance issued in Japanese application P2007-156702 on Feb. 1, 2011 (no translation available; submitted for certification purposes only).
Office Action issued in Taiwanese application 096138265 on Feb. 24, 2011 (no translation available; submitted for certification purposes only).
Office Action issued in a counterpart Korean application mailed on Dec. 7, 2010.
Notice of Allowance issued in counterpart Korean application 10-2009-7009681 on Jul. 30, 2012 (no translation available; submitted for certification).
Office Action issued in co-pending U.S. Appl. No. 12/743,200 on Dec. 21, 2012.
Office Action issued in corresponding Japanese application 2009-541130 on May 8, 2012.
"Presentation of Publications and the Like" submitted by a third-part in corresponding Japanese application 2009-541130 on Apr. 12, 2012.
Office Action issued in counterpart Japanese application 2012-15259 on Apr. 23, 2013, with partial English translation.
Patent Abstracts of Japan English Abstract corresponding to JP 2005-072115, previously filed on Dec. 18, 2012 as (Exhibit A).
Patent Abstracts of Japan English Abstract corresponding to JP 2005-252062 filed herewith as (Exhibit B).
Office Action issued in co-pending related U.S. Appl. No. 12/743,200 on May 2, 2013.
Machine translation of JP2005-243935A.
Partial translations of JP2005-243935A, paragraph [28], by Steven Spar of USPTO Translation Services Center.

* cited by examiner

Fig.5
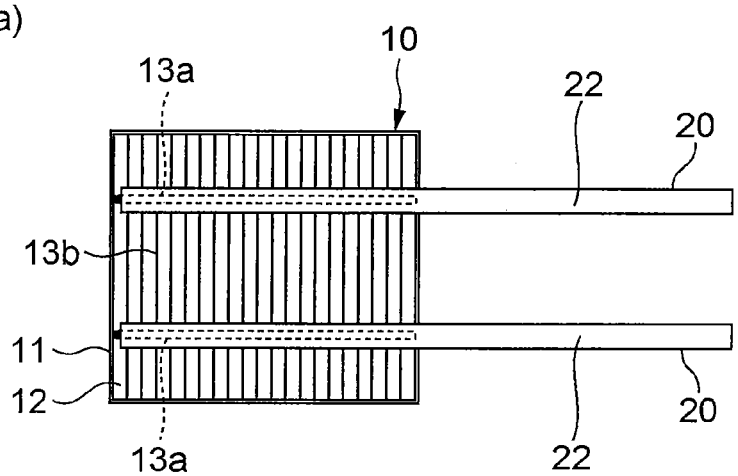
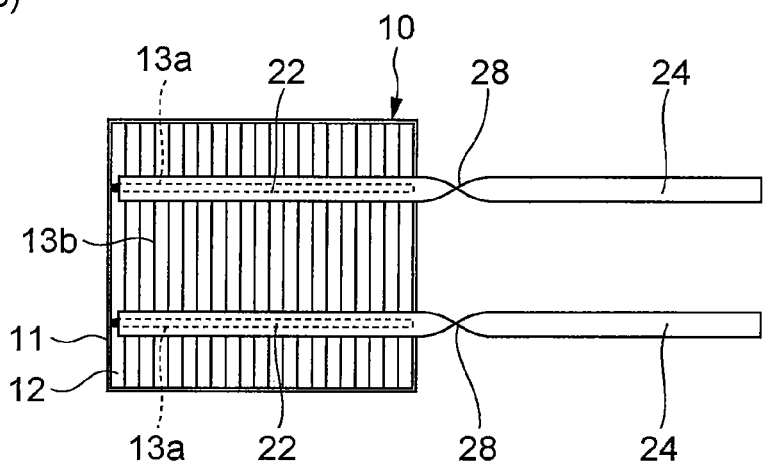
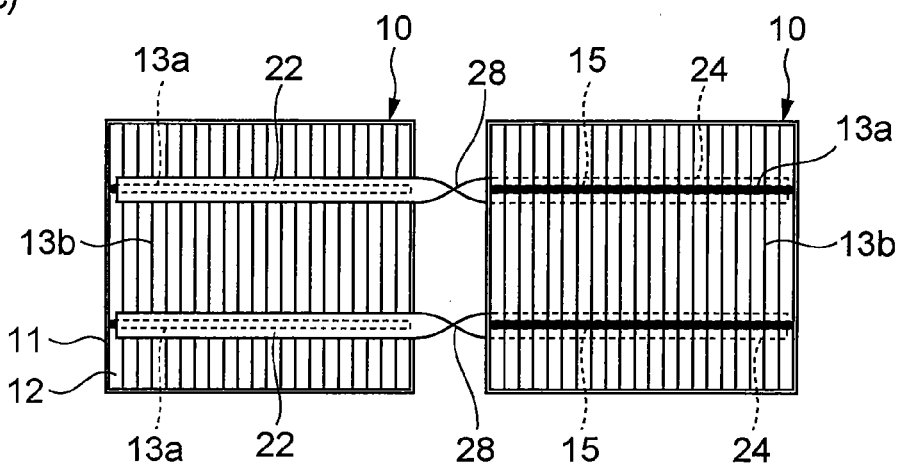

Fig.7
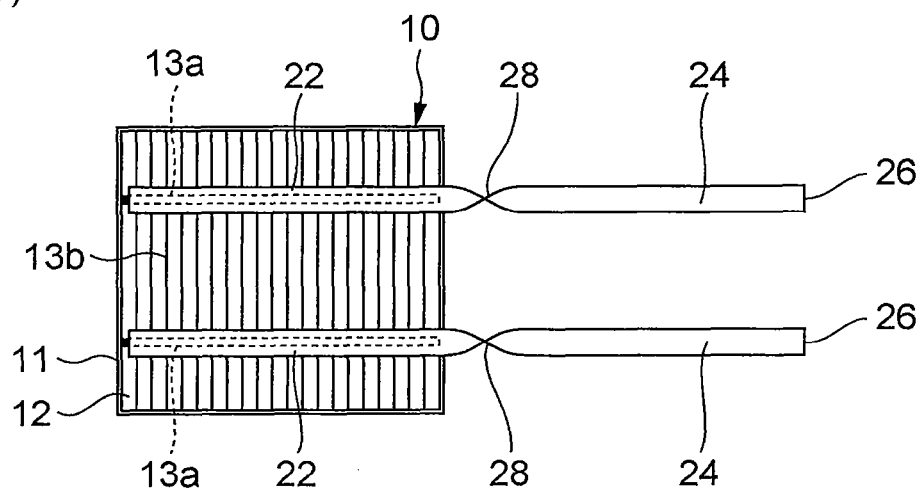
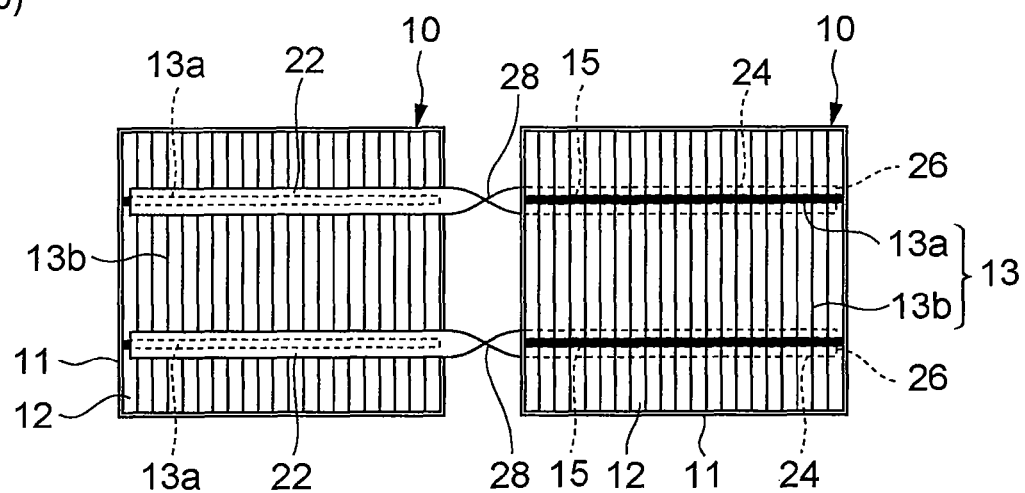

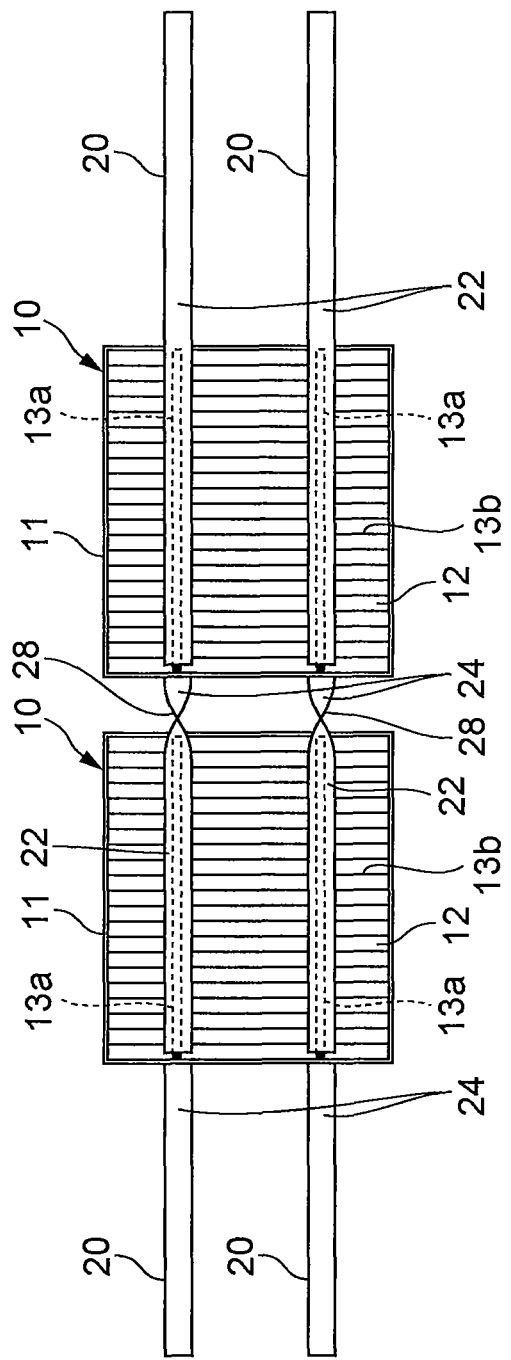

SOLAR BATTERY CELL CONNECTION METHOD AND SOLAR BATTERY MODULE

This is a National Phase Application in the United States of International Patent Application No. PCT/JP2007/069730 filed Oct. 10, 2007, which claims priority on Japanese Patent Application No. 2006-279907 filed Oct. 13, 2006, No. 2007-119404 filed Apr. 27, 2007, and No. 2007-156702 filed Jun. 13, 2007. The entire disclosures of the above patent applications are hereby incorporated by reference.

TECHNICAL FIELD

The present invention relates to a method of connecting solar battery cells and a solar battery module.

BACKGROUND ART

While various solar batteries are being used, when the output voltage is prescribed, a solar battery module in which a plurality of solar battery cells are connected in series is used. Such a solar battery module is configured such that a front-face electrode formed on a light-receiving-surface side of a solar battery cell is electrically connected with a back-face electrode formed on the back face of an adjacent solar battery cell through a wiring member such as a lead wire. Conventionally, solder has been used for connecting the electrode with the wiring member (see for example Patent Documents 1 and 2). Solder is widely used since it is excellent in connection reliability such as in conductivity and adhesive strength, as well as is inexpensive and versatile.

Further, from the view point of environmental protection and others, a method of connecting wirings without using solder has been studied. For example, the below listed Patent Documents 3 to 6 disclose connection methods utilizing paste-like and film-like conductive adhesives.

Patent Document 1: Japanese Patent Laid-Open No. 2004-204256
Patent Document 2: Japanese Patent Laid-Open No. 2005-050780
Patent Document 3: Japanese Patent Laid-Open No. 2000-286436
Patent Document 4: Japanese Patent Laid-Open No. 2001-357897
Patent Document 5: Japanese Patent No. 3448924
Patent Document 6: Japanese Patent Laid-Open No. 2005-101519

DISCLOSURE OF THE INVENTION

However the aforementioned conventional arts have problems as described below. That is, in the connection method using solder as described in Patent Documents 1 and 2, since the typical melting temperature of solder is about 230 to 260° C., high temperatures and volume shrinkages associated with such connection method may adversely affect the semiconductor structure of the solar battery cell thereby causing fracture and warpage of the cell and peeling of the wiring in a fabricated solar battery module. As a result of that, the yield of product is likely to decline. Moreover, since connection by solder has difficulty in controlling the distance between the electrode and the wiring member, it is difficult to achieve sufficient dimensional accuracy at the time of packaging. Failing to achieve sufficient accuracy will lead to a decline in the yield of product in the packaging process. Further, a study by the present inventors has revealed that the properties of a solar battery module fabricated by solder connection may be significantly degraded over time under a high temperature and high humidity condition.

On the other hand, since the technique of connecting a electrode and a wiring member by using a conductive adhesive as described in Patent Documents 3 to 6 enables bonding at a lower temperature compared with the case of using solder, it is considered that such a technique can suppress the adverse effects on a solar battery cell caused by heating at a high temperature. However, in order to fabricate a solar battery module by such a technique, it is necessary to repeat, for every electrode, the process of firstly forming an adhesive layer by applying or laminating a film-like conductive adhesive on an electrode of a solar battery cell and then aligning and thereafter bonding a wiring member to the formed adhesive layer. Thus, a problem exists in that the production process becomes complicated thereby reducing productivity.

The present invention has been made in view of the aforementioned circumstances, and its object is to provide a method of connecting solar battery cells, which enables to simplify the production process as well as to achieve a high-reliability solar battery module at a high yield. It is also an object of the present invention to provide a high-reliability solar battery module.

The first method of connecting solar battery cells of the present invention for solving the aforementioned problems is a method of connecting solar battery cells which are each provided with a front-face electrode on a front face thereof and a back-face electrode on a back face thereof, and comprises: a first process of preparing a wiring member including a strip-like conductive substrate and an adhesive layer provided on one face of the conductive substrate, and bonding the adhesive layer on one end portion of the wiring member with a front-face electrode or a back-face electrode of one solar battery cell; a second process of turning an other end portion of the wiring member having gone through the first process, around a central axis along a longitudinal direction thereof so that an adhesive layer surface of the other end portion is opposite in orientation to an adhesive layer surface of the one end portion; and a third process of bonding the adhesive layer of the other end portion of the wiring member having gone through the second process with an electrode of an other solar battery cell having an opposite polarity to the electrode of the one solar battery cell which has been bonded in the aforementioned first process.

Further, a second method of connecting solar battery cells of the present invention is a method of connecting solar battery cells which are each provided with a front-face electrode on a front face thereof and a back-face electrode on a back face thereof, and comprises: a first process of preparing a turned-around wiring member by turning one end portion of a wiring member including a strip-like conductive substrate and an adhesive layer provided on one face of the conductive substrate, around a central axis along a longitudinal direction thereof so that an adhesive layer surface of the other end portion is opposite in orientation to an adhesive layer surface of the one end portion, and bonding the adhesive layer on one end portion of the turned-around wiring member with a front-face electrode or a back-face electrode of one solar battery cell; and a second process of bonding the adhesive layer of the other end portion of the turned-around wiring member with an electrode of an other solar battery cell having an opposite polarity to the electrode of the one solar battery cell which has been bonded in the aforementioned first process.

According to the first and second connection methods of solar battery cells, applying the aforementioned processes using the aforementioned wiring member enables to easily arrange an adhesive layer between the front-face electrode and the back-face electrode of solar battery cells adjacent to the wiring member (conductive substrate) and to connect each electrode with a conductive substrate at a lower temperature compared with case in which solder is used, as a result of which it becomes possible to connect solar battery cells in series in an easy and sufficient manner. Thus, according to the first and second methods of connecting solar battery cells, it becomes possible to simplify the production process as well as to obtain high-reliability solar battery modules at a good yield.

Moreover, according to the method of connecting solar battery cells of the present invention, it is possible to dispose a turned-around part, which is formed by turning one end portion of a strip-like conductive substrate around its central axis along the longitudinal direction, between solar battery cells. The present inventors infer that the turned-around part is expected to mitigate impacts, which will contribute to the improvement of reliability of the solar battery module.

In the first and second methods of connecting solar battery cells of the present invention, in view of ensuring the conductivity between solar battery cells, the aforementioned conductive substrate preferably includes one or more metal elements selected from the group consisting of Cu, Ag, Au, Fe, Ni, Pb, Zn, Co, Ti and Mg.

Further, in the first and second methods of connecting solar battery cells of the present invention, the aforementioned adhesive layer is preferably a conductive adhesive layer. In this case, for example, adapting the adhesive layer to contain conductive particles will enable to reduce the connection resistance between the front-face electrode or the back-face electrode of solar battery cell and the conductive substrate thereby making it easy to improve FF (Fill Factor) characteristics.

Furthermore, the present invention provides a solar battery module, wherein a plurality of solar battery cells having a front-face electrode on a front face thereof and a back-face electrode on a back face thereof are arranged in a plane with the front-face sides thereof facing the same surface side, and a strip-like conductive substrate, which is provided for connecting the front-face electrode of one solar battery cell with the back-face electrode of the other solar battery cell of adjacent solar battery cells, has a turned around part between solar battery cells, the turned-around part being formed by turning one end portion of the conductive substrate around a central axis along a longitudinal direction thereof.

A solar battery module having such a configuration can be produced by the aforementioned first and second connection methods of solar battery cells of the present invention, and therefore is highly reliable and is excellent in productivity. Further, the present inventors infer that the aforementioned turned-around part can serve to mitigate impacts, which is also a factor to achieve a high reliability.

Effects of the Invention

According to the present invention, it is possible to simplify the production process as well as to provide: a method of connecting solar battery cells, which enables to obtain a high-reliability solar battery module at a good yield; and a high-reliability solar battery module.

BRIEF DESCRIPTION OF THE DRAWINGS

FIG. 5 is a schematic view to illustrate a method of connecting solar battery cells relating to the present invention;

FIG. 7 is a schematic view to illustrate a method of connecting solar battery cells relating to the present invention; and FIG. 8 is a schematic view to illustrate a solar battery module fabricated in an example.

BEST MODES FOR CARRYING OUT THE INVENTION

Figure 1:
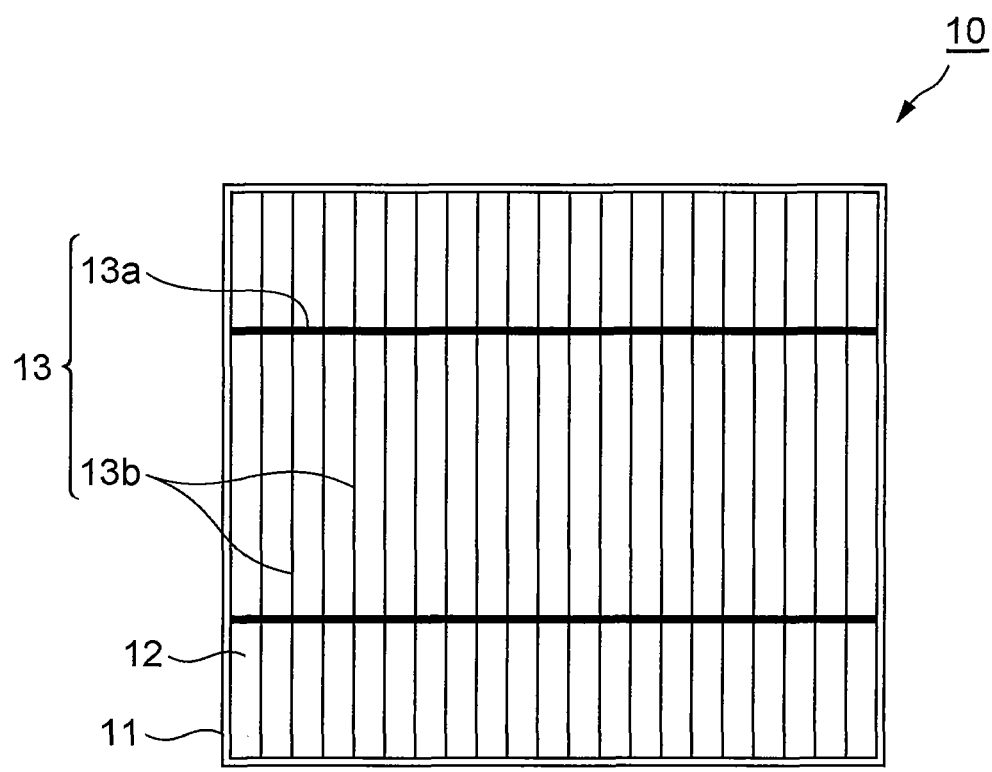
FIG. 1 is a schematic view of the front face of a solar battery cell.

Hereafter, preferred embodiments of the present invention will be described in detail with reference to the drawings as needed. It is noted that like elements are designated by like reference characters and duplication in description will be omitted. Moreover, the positional relationships in such as up/down and right/left directions are based on the relationships shown in the drawings unless otherwise stated. Further, the dimensional ratio in the drawing will not be limited to the ratio shown.

Figure 2:
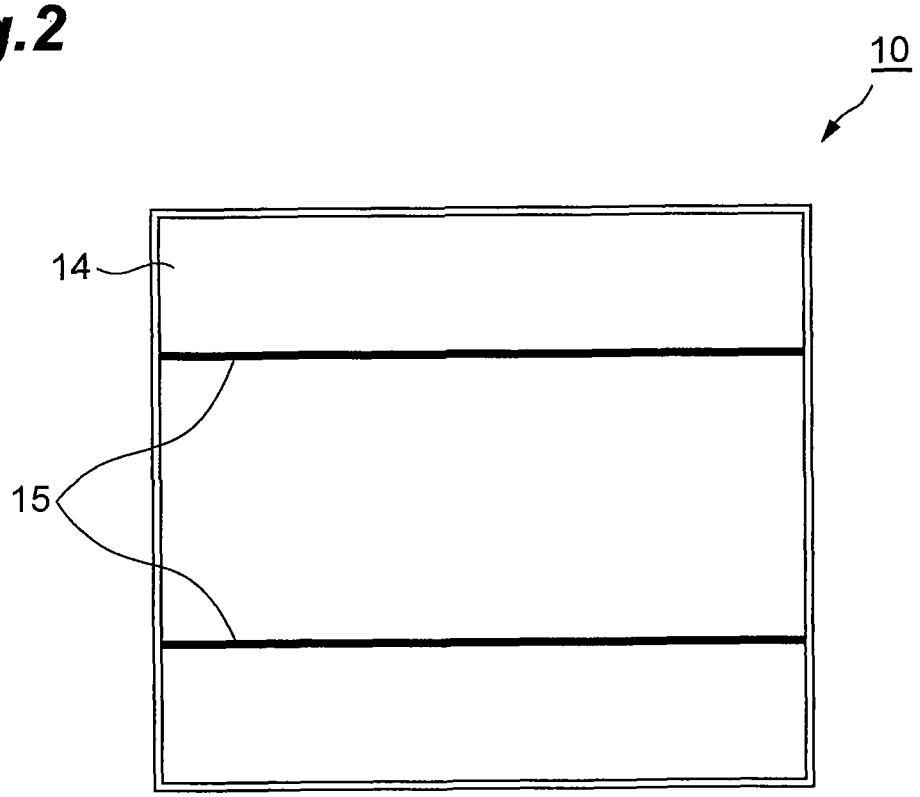
FIG. 2 is a schematic view of the back face of a solar battery cell.

First, description will be made on a solar battery cell which is provided with a front-face electrode on its front face and a back-face electrode on its back face, and which is to be connected by the method of connecting solar battery cells of the present invention. FIG. 1 is a schematic view of a solar battery cell relating to the present invention, seen from the side of the light receiving surface. In the present specification, the light receiving surface is referred to as a front face of the solar battery cell. Further, FIG. 2 is a schematic view of the solar battery 10 shown in FIG. 1, seen from the back-face side thereof. The solar battery 10 shown in FIGS. 1 and 2 is provided with a light receiving part 12 on one surface of a planer base plate 11. As shown in FIG. 1, a front-face electrode 13 made up of a bus-bar electrode 13a and a finger electrode 13b is provided on the front face of the solar battery 10, that is, the front face of the light receiving part 12. Further, as shown in FIG. 2, an aluminum paste fired layer 14 and a back-face electrode 15 are provided on the back face of the solar battery 10, that is, the side of the substrate opposite to the light receiving part.

Examples of the substrate of the solar battery 10 include those made up of at least one or more of single-crystalline, polycrystalline and non-crystalline Silicon. In the present embodiment, the light-receiving-part side of the substrate may be an N-type semiconductor layer or a P-type semiconductor layer.

Examples of the front-face electrode 13 include those made of known materials which can provide electrical conductivity, for example, common glass paste containing silver; adhesive resins dispersed with various conductive particles such as silver paste, gold paste, carbon paste, nickel paste and aluminum paste; and ITO formed by firing or vapor deposition. Among those, glass paste electrodes containing silver are most preferably used in the view point of heat resistance, conductivity, stability, and cost.

In the case of solar battery cell, an Ag electrode and Al electrode are provided as the back-face electrode primarily by applying silver paste and aluminum paste on a substrate made of at least one or more of single-crystalline, polycrystalline, and non-crystalline silicon by means of screen printing etc. and drying and firing them as needed. In the case of tab wire connection by solder, since solder does not wet a fired product of aluminum paste, a back-face electrode 15, for example, a silver electrode is provided on the aluminum paste fired layer 14 as in the solar battery 10. Although, in the present embodiment, connection of solar battery cells having such configuration are performed, since according to the present invention, the wiring member relating to the present invention can be bonded to a fired product of aluminum paste, it is also possible to connect solar battery cells in which only the aluminum paste fired layer is provided as the back-face electrode. Such a configuration is advantageous in cost and productivity since there is no need of providing a silver electrode etc.

Figure 3:
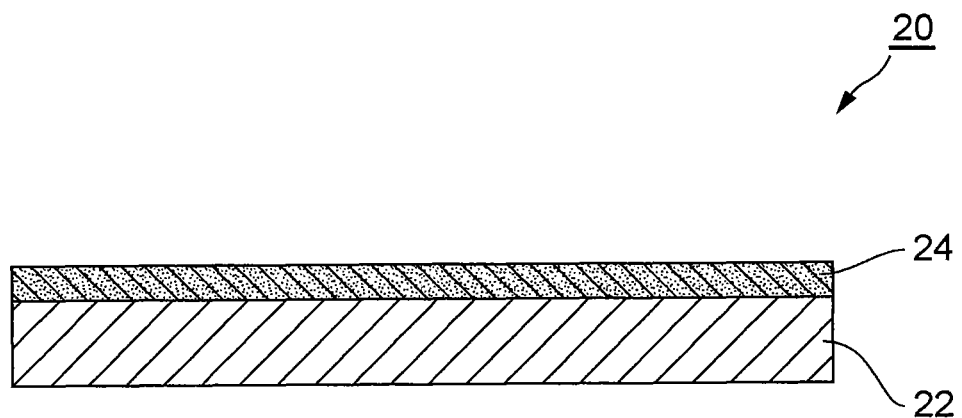
FIG. 3 is a schematic sectional view to show one embodiment of the wiring member relating to the present invention.

Next, the wiring member to be used in the method of connecting solar battery cells of the present invention will be described. FIG. 3 is a schematic sectional view to show a first embodiment of the wiring member relating to the present invention. The wiring member 20 shown in FIG. 3 includes a strip-like conductive substrate 22 and a conductive adhesive layer 24 provided on one face of the conductive substrate 22.

Though the material for the conductive substrate 22 is not particularly limited provided that it contains a metal as the primary component, examples of which include those formed of gold, silver, copper, iron, stainless steel, 42 alloy and solder plated copper. In the viewpoint of improving conductivity, the conductive substrate 22 preferably includes one ore more metals selected from the group consisting of Cu, Ag, Fe, Ni, Pb, Zn, Co, Ti, and Mg.

The conductive substrate 22 preferably has a rectangular sectional shape. Such configuration will facilitate the application of a paste-like conductive adhesive or the lamination of a preformed film-like conductive adhesive on the conductive substrate 22 to provide the conductive adhesive layer 24 described below, and will also improve the connectivity with the front-face electrode 13 and the back-face electrode 15. Further, since it becomes possible to easily control the distance between the conductive substrate 22 and the front-face electrode 13 or the back-face electrode 15, the dimensional accuracy during packaging can be improved.

Although it is preferable that the thickness of the conductive substrate 22 is appropriately set depending on the value of the current flowing from the solar battery cell, from the viewpoint of the resistance value, it is preferably 150 to 300 μm, and more preferably 200 to 250 μm. While the width and the length of the conductive substrate 22 are appropriately set depending on the size of the electrode of the solar battery cell to be connected, since larger width will decrease the light receiving area thereby reducing the power generation efficiency per unit area, it is normally set to be 1 to 3 mm.

It is preferable that the conductive adhesive layer 24 at least contains an adhesive component and conductive particles dispersed therein. The adhesive component is preferably a resin composition containing a thermosetting resin from the viewpoint of further improving connectivity, but is not particularly limited thereto and may be any material provided it exhibits adhesion.

As the thermosetting resin, known materials can be used; examples of which include epoxy resin, phenoxy resin, acrylic resin, polyimide resin, polyamide resin, and polycarbonate resin. These thermosetting resins may be used separately as a single component or in combination of two or more kinds. Among those, in the viewpoint of further improving connection reliability, one or more kinds of thermosetting resins selected from the group consisting of epoxy resin, phenoxy resin, and acrylic resin are preferable.

The resin composition as the adhesive component may contain a known curing agent and a curing accelerator as an optional component besides the aforementioned thermosetting resins. Moreover, the resin composition may contain modifying materials such as silane-base, titanate-base, and aluminate-base coupling agents to improve the adhesion and wettability to the front-face electrode 13, the back-face electrode 15 and the conductive substrate 22; and also may contain dispersing agents such as calcium phosphate and calcium carbonate to improve the uniform dispersibility of the conductive particles. Further, the resin composition may contain rubber components such as acrylic rubber, silicon rubber, and urethane to control the elasticity and tackiness; and may also contain chelating agents etc. to suppress the migration of metals (particularly silver and copper) contained in the front-face electrode 13, the back-face electrode 15, the conductive substrate 22, and the conductive particles.

Though the kind of the conductive particle is not particularly limited, examples of which include gold particles, silver particles, copper particles, nickel particles, gold-plated particles, copper-plated particles, and nickel-plated particles. Further, the conductive particles preferably have a chestnuts-in-burs like shape or a spherical shape in view of sufficiently filling the surface asperities of an adherend (for example, an electrode and a conductive substrate) at the time of connection to ensure a sufficient electrical connection between adherends. That is, if the conductive particles have a chestnuts-in-burs like shape or a spherical sphere, they can sufficiently fill asperities on an adherend surface even when the adherend surface has a complex asperity shape, which will improve the responsiveness of the conductive particles to the changes in vibration and expansion after connection, and therefore is preferable.

Examples of the manufacturing method of the wiring members 20 include a method of providing a film-like conductive adhesive layer 24 by evaporating the solvent after applying a paste-like conductive adhesive on the conductive substrate 22, and a method of providing a film-like conductive adhesive layer 24 by laminating a prefabricated film-like conductive adhesive on the conductive substrate 22. It is noted that as the paste-like conductive adhesive, resin compositions including the aforementioned thermosetting resin in which conductive particles are dispersed can be used. Further, the paste-like conductive adhesive can be used to prefabricate a film-like conductive adhesive. It is noted that in the present embodiment, in view of equalizing the dimensional accuracy of the film thickness of the conductive adhesive layer 24 and the pressure distribution during the pressure bonding of adhesive layer, a method of laminating a prefabricated film-like conductive adhesive on the conductive substrate 22 is preferable. In this case, it is preferable that after a film-like conductive adhesive is placed on the surface of the conductive substrate 22, they are pressed in the lamination direction to be temporarily pressure bonded.

The paste-like conductive adhesive is obtained by mixing the aforementioned thermosetting resin, a resin composition including other optional components, and the aforementioned conductive particles, and they can be used as they are when they are in a liquid state at room temperature (25° C.). When the aforementioned mixture is in a solid state at room temperature, it is possible to turn the mixture into paste by heating it as well as by using a solvent. There is no limitation on the kind of the solvent that can be used provided that it does not react with the aforementioned resin composition and exhibits sufficient solubility.

Further, when a film-like conductive adhesive is prefabricated, it can be obtained by applying the aforementioned paste-like conductive adhesive on a peelable substrate such as a fluorine resin film, a polyethylene terephthalate film, and a releasing paper, or impregnating the aforementioned adhesive into a substrate such as a non-woven cloth; placing it on the peelable substrate; and removing the solvent. Such a film-like conductive adhesive is easy-to-handle and can facilitate the fabrication of the wiring member 20. Further, in this case, the peelable substrate is peeled off and removed immediately before placing the film-like conductive adhesive on the surface of the conductive substrate 22 or after placing the same.

The paste-like conductive adhesive can be applied by using an applicator, a roll coater, a comma coater, a knife coater, a doctor blade flow coater, an enclosed coater, a die coater, a lip coater, and others. In this respect, the film thickness of the conductive adhesive layer to be formed can be controlled by the gap adjustment of an applicator or a lip coater. Moreover, the film thickness of the conductive adhesive layer can also be controlled by adjusting the amount of a non-volatile portion such as thermosetting resin etc. contained in the paste-like conductive adhesive.

Figure 4:
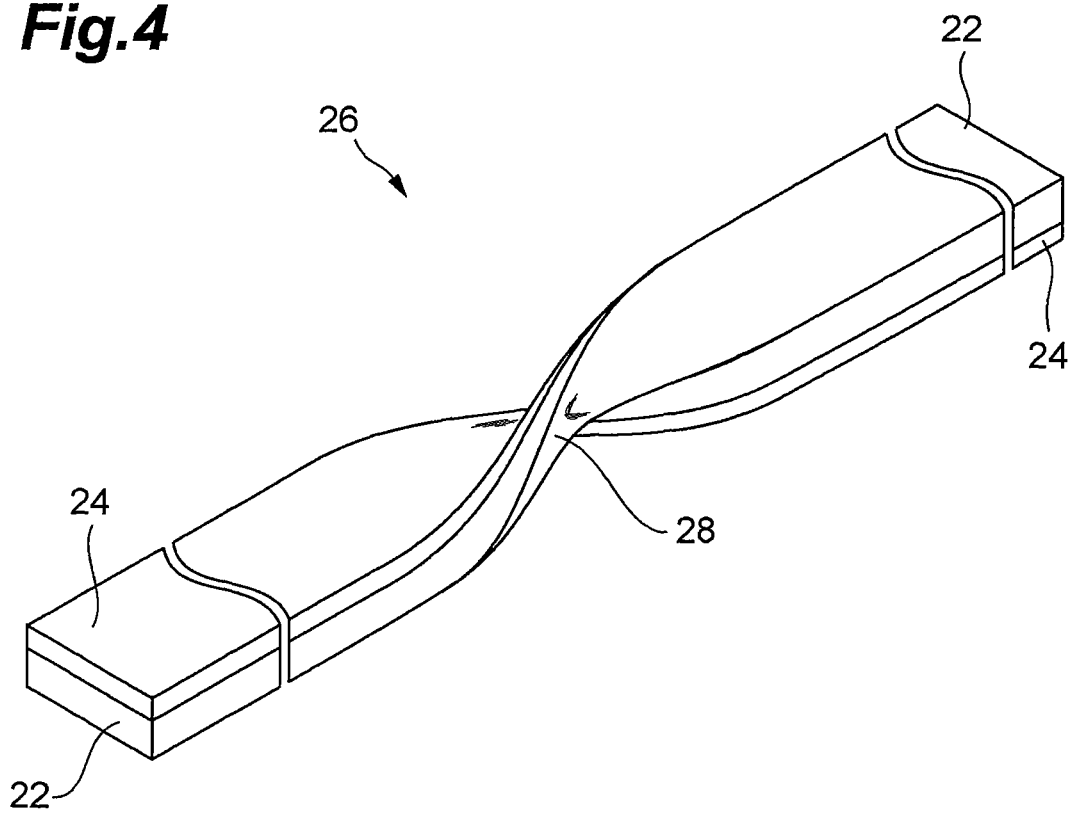
FIG. 4 is a perspective view to show another embodiment of the wiring member relating to the present invention.

Next, another embodiment of the wiring member used in the method of connecting solar battery cells of the present invention will be described. FIG. 4 is a perspective view to show a second embodiment of the wiring member relating to the present invention. A turned-around wiring member 26 shown in FIG. 4 is configured such that one end portion of the wiring member 22 shown in FIG. 3 is turned around the central axis along the longitudinal direction thereof so that the conductive adhesive layer surface of the one end portion is opposite in orientation to the conductive adhesive layer surface of the other end portion. This turned-around wiring member 26 has a turned-around part 28, which is formed by turning one end portion thereof around the central axis along the longitudinal direction, in approximately the middle portion thereof.

Next, the method of connecting solar battery cells using the aforementioned wiring member 20 will be described.

First, a wiring member 20 including a strip-like conductive substrate 22 and a conductive adhesive layer 24 provided on one surface of the conductive substrate is prepared, and the conductive adhesive layer 24 on the one end portion of the wiring member 20 is pasted to a bus-bar electrode 13a of one solar battery cell 10 so as to be bonded together while being aligned therewith. At this moment, they may be temporarily pressure bonded by applying pressure in the lamination direction.

Next, the wiring member bonded as described above is heated and pressurized in the lamination direction to obtain a connection structure laminated in the order of a front-face electrode 13, a hardened substance of the conductive adhesive layer, and the conductive substrate 22. As a result of which, the front-face electrode 13 and the conductive substrate 22 are bonded by the hardened substance of the conductive adhesive layer and an electrical connection between them is ensured through the hardened substance of the conductive adhesive layer (see FIG. 5(a)).

The heating temperature and the pressuring pressure are not particularly limited provided that they are within a range that the aforementioned electrical connection is ensured and the front-face electrode 13 and the conductive substrate 22 are sufficiently bonded by a hardened substance of the conductive adhesive layer. It is noted that various conditions for such pressurizing and heating are appropriately selected depending on the purpose of use, each component of the adhesive components, and the material of the adherent. For example, the heating temperature may be a temperature at which the thermosetting resin will harden. Moreover, the pressurizing pressure may be within a range in which the front-face electrode 13 and the conductive adhesive layer 24 are brought into a sufficiently intimate contact and yet neither of them will be damaged. Further, the heating/pressurizing time may be arbitrary, provided that an excess amount of heat will not be propagated to the front-face electrode 13 and the conductive substrate 22 thereby damaging or altering the materials thereof.

Next, an other end portion (a portion that is not bonded) of the wiring member bonded as described above is turned around the central axis along the longitudinal direction thereof so that the conductive adhesive layer surface of the other end portion is opposite in orientation to the one end portion of the conductive adhesive layer surface (see FIG. 5(b)).

Next, the conductive adhesive layer 24 on the other end portion of the turned-around wiring member 20 is bonded to a back-face electrode 15 of another solar battery cell. At this moment, they may be temporarily pressure bonded by applying pressure in the lamination direction.

Next, the wiring member bonded as described above is heated and pressurized in the lamination direction to obtain a connection structure laminated in the order of the back-face electrode 15, a hardened substance of the conductive adhesive layer, and the conductive substrate 22. As a result of which, the back-face electrode 15 and the conductive substrate 22 are bonded by the hardened substance of the conductive adhesive layer and an electrical connection between them is ensured through the hardened substance of the conductive adhesive layer (see FIG. 5(c)).

By being subjected to such processes, solar battery cells can be connected in series in a very convenient manner compared with the case in which an adhesive layer is formed by applying or laminating a film-like conductive adhesive onto an electrode of the solar battery cell. It is noted that, in the present embodiment, although the wiring member is first bonded to the front-face electrode and then to the back-face electrode, the order may be reversed.

In the connection structure which is obtained by going through the aforementioned processes, conductive particles dispersed in the conductive adhesive layer provide sufficient electrical connections between the front-face electrode and the conductive substrate as well as between the back-face electrode and the conductive substrate. Further, the hardened substance of the conductive adhesive layer bonds the front-face electrode with the conductive substrate as well as the back-face electrode with the conductive substrate at a sufficient connection strength. As a result of these, the connection structure becomes to have an excellent connection reliability. Moreover, according to the method of connecting solar battery cells of the present embodiment, since there is no need of using solder to ensure electric connection, the property degradation of the connection structure is sufficiently controlled thereby ensuring a sufficient dimensional accuracy and satisfactorily preventing the decline of the yield of product.

Figure 6:
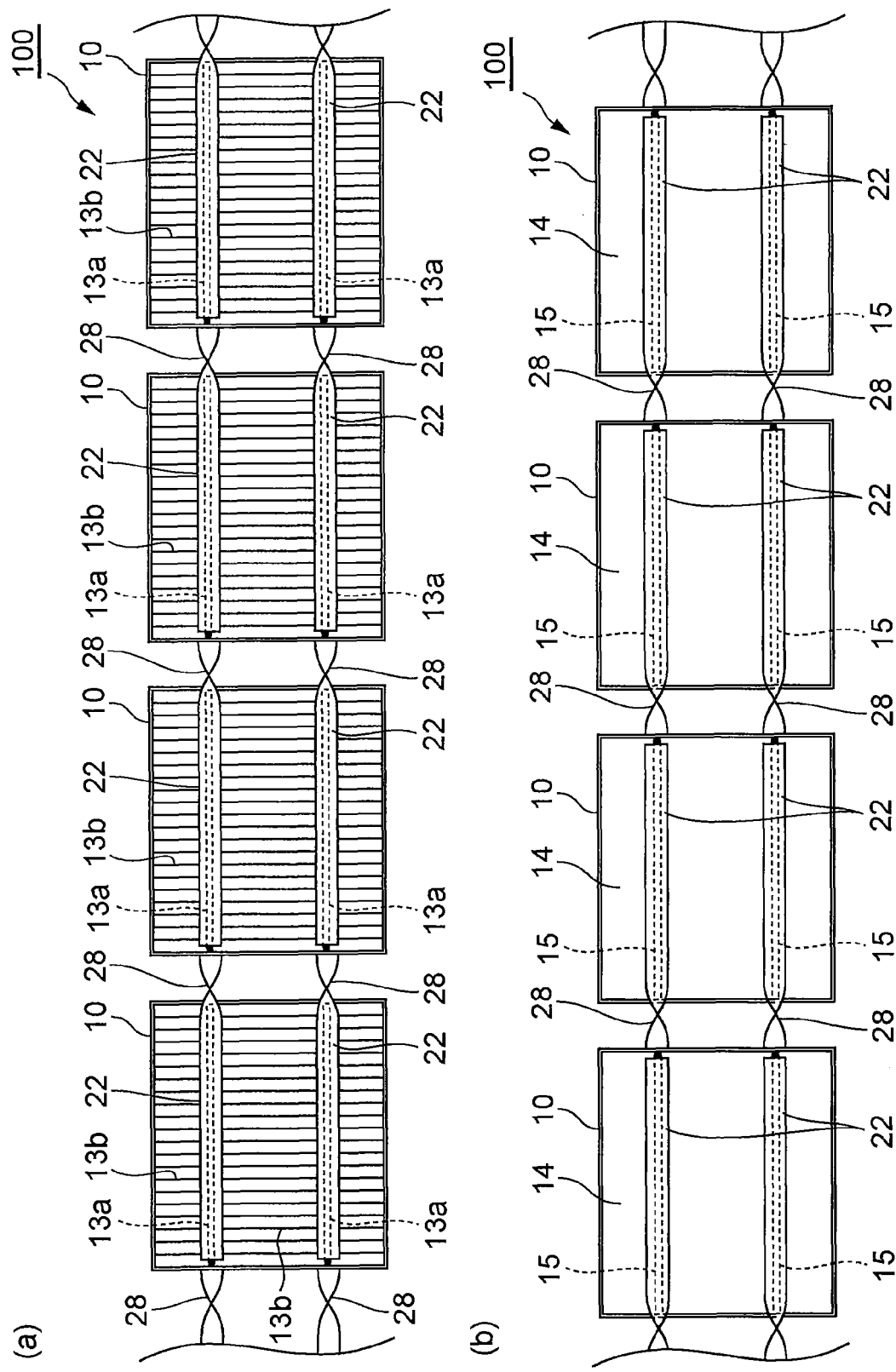
FIG. 6 a schematic view to show one embodiment of a solar battery module relating to the present invention, in which (a) is a view seen from the side of the front-face electrode and (b) is a view from the side of the back-face electrode.

Then, repeatedly applying the aforementioned method of connecting solar battery cells relating to the present invention makes it possible to obtain a solar battery module 100 as shown in FIG. 6 in which: a plurality of solar battery cells 10 are arranged in a planar form with the light receiving parts 12

(the front-face side) thereof facing the same side; and a strip-like conductive substrate 22, which is provided for connecting the front-face electrode of one solar battery cell of adjacent solar battery cells with the back-face electrode of the other solar battery cell, has a turned-around part 28 which is obtained by turning one end portion thereof around its central axis along the longitudinal direction. FIG. 6(a) is a schematic view of the solar battery module 100 seen from the side of the light receiving part 12 (the front-face side of the solar battery cell), and FIG. 6(b) is a schematic view of the solar battery module 100 seen from the side of the base plate 11 (the back-face side of the solar battery cell). It is noted that the solar battery module 100 shown in FIG. 6 shows principal parts of the solar battery module. In practical uses, an arrangement in which the solar battery module 100 is sandwiched by reinforced glass etc. with the gap therebetween being filled with a transparent resin for environmental resistance, and is further provided with an external terminal, is used as a solar battery module.

Since the solar battery module 100 is configured such that the front-face electrode 13 and the back-face electrode 15 of adjacent solar battery cells are connected by the aforementioned connection method relating to the present invention using the aforementioned wiring member 20 relating to the present invention, adverse effects against the solar battery cell are sufficiently suppressed so that the solar battery cell can have an excellent dimensional accuracy and a sufficient connection reliability. As a result of this, the solar battery module 100 can maintain sufficient properties for long hours even under a high temperature and high humidity condition.

Further, the solar battery module 100 has an advantage of having an excellent impact resistance. The reason why such advantage is obtained is attributed to that the turned-around part provided between solar battery cells of the solar battery module exhibits a spring effect so that impacts in the direction vertical to the surface of the solar battery cell are mitigated.

So far, preferred embodiments of the present invention have been described, but the present invention will not be limited to the aforementioned embodiments. The present invention may be altered in various ways within a range not departing from its spirit.

For example, in the method of connecting solar battery cells of the present embodiment, a turned-around wiring member 26 shown in FIG. 4 can be used in place of the wiring member 20 to perform the connection of solar battery cells. In such a case, first, the turned-around wiring member 26 is prepared and the conductive adhesive layer of one end portion of the turned-around wiring member 26 is pasted to a bus-bar electrode 13a of one solar battery cell so as to be bonded together while being aligned therewith (see FIG. 7(a)). Next, the conductive adhesive layer of the other end portion of the turned-around wiring member 26 is bonded to the back-face electrode 15 of the other solar battery cell (see FIG. 7(b)). It is noted that the hardening of conductive adhesive layer can be carried out in the same way as in the case in which the aforementioned wiring member 20 is used. Such a connection method also enables to fabricate the solar battery module shown in FIG. 6.

Although, in the present embodiment, the turned-around wiring member is first bonded to the front-face electrode and then to the back-face electrode, the both processes may be carried out in a reversed order or in a concurrent manner.

Further, in the present embodiment, in place of the wiring member 20 made up of the conductive substrate 22 and the conductive adhesive layer 24, a wiring member in which an adhesive layer is provided on a conductive substrate 22 may be used. Furthermore, in the present embodiment, in place of the turned-around wiring member 26 made up of the conductive substrate 22 and the conductive adhesive layer 24, a turned-around wiring member, which is configured such that one end portion of a wiring member provided with an adhesive layer on the conductive substrate 22 is turned around the central axis along the longitudinal direction thereof so that the adhesive layer surface of the one end portion is opposite in orientation to the adhesive layer surface of the other end portion, may be used. When such a wiring member is used, it is preferable to pressurize the bonded wiring member in the laminating direction while heating it until the electrode and the conductive substrate is electrically connected. As a result of this, the electrode and the conductive substrate are bonded by a hardened substance of the adhesive layer, and the electrical connection between them is ensured.

The adhesive components making up adhesive layers of such wiring member and turned-around wiring member are not particularly limited provided that they exhibit adhesion; however, in the viewpoint of further improving connectivity, they are preferably resin compositions containing thermosetting resin.

As the thermosetting resin, known materials can be used; examples of which include epoxy resin, phenoxy resin, acrylic resin, polyimide resin, polyamide resin, and polycarbonate resin. These thermosetting resins may be used separately as a single component or in combination of two or more kinds. Among those, in the viewpoint of further improving connection reliability, one or more kinds of thermosetting resins selected from the group consisting of epoxy resin, phenoxy resin, and acrylic resin are preferable.

The resin composition as the adhesive component may contain a known curing agent and a curing accelerator as an optional component besides the aforementioned thermosetting resins. Moreover, the resin composition may contain modifiers such as silane-base, titanate-base and aluminate-base coupling agents to improve the adhesion and wettability to the front-face electrode 13, the back-face electrode 15 and the conductive substrate 22. Further the resin composition may contain rubber components such as acrylic rubber, silicon rubber, and urethane to control the elasticity and tackiness, and may also contain chelating agents etc. to suppress the migration of the front-face electrode 13, the back-face electrode 15, and the conductive substrate 22.

Further, the heating temperature and the pressurizing pressure are not particularly limited provided they are within a range that the aforementioned electrical connection is ensured, and the electrode and the conductive substrate are sufficiently bonded by a hardened substance of the adhesive layer. It is noted that various conditions for such heating and pressurizing are appropriately selected depending on the purpose of use, each component of the adhesive components, and the material of the adherent. For example, the heating temperature may be a temperature at which thermosetting resin will harden. Moreover, the pressurizing pressure may be within a range in which the electrode and the conductive substrate are brought into a sufficiently intimate contact and yet neither of them will be damaged. Further, the heating/pressurizing time may be arbitrary, provided that an excess amount of heat will not be propagated to the electrode and the conductive substrate thereby damaging or altering the materials thereof.

EXAMPLES

Hereafter, the present invention will be further described in detail by way of examples, but the present invention will not be limited by those examples.

Example 1

First, two solar battery cells (trade name "125 square cell multicrystalline MOT T1," manufactured by MOTECH (Motech Industries, Inc.)) having the same configuration as that shown in FIGS. 1 and 2 were prepared, in which a front-face electrode (of 2 mm wide and 12.5 cm long) formed of silver glass paste was provided on the front face of a polycrystalline silicon wafer; an electrode formed of aluminum past was provided on the back-face thereof; and a back-face electrode formed of silver glass paste were provided on the aforementioned electrode.

On the other hand, acrylic rubber (trade name "KS8200H," molecular weight: 850000, manufactured by HITACHI CHEMICAL Co., Ltd.) was prepared, which was formed by copolymerizing 40 parts by mass of butylacrylate, 30 parts by mass of ethylacrylate, 30 parts by mass of acrylnitrile, and 3 parts by mass of glycidyl methacrylate.

Next, 124 g of the aforementioned acrylic rubber and 50 g of phenoxy resin (trade name "PKHC," weight average molecular weight: 45000, manufactured by Union Carbide Corporation) were dissolved into 400 g of ethyl acetate to obtain a solution with 30% by mass of solid content. Then, 325 g of liquid epoxy resin (trade name "Novacure™ HX-3941HP," epoxy equivalent weight 185 g/eq, manufactured by ASAHI KASEI CHEMICALS Corporation) was added to the aforementioned solution and the solution is further stirred to obtain a paste-like resin composition as the adhesive component.

Next, nickel particles having an average diameter of 12 μm (apparent density: 3.36 g/cm$^3$) are added to and dispersed in the resin composition obtained as described above, as the conductive particles. Thus, a paste-like conductive adhesive containing 5% by volume of conductive particles with respect to the total volume of the adhesive component and the conductive particles was obtained. It is noted that the average diameter of the conductive particles was derived through the observation by a scanning electron microscope (SEM, trade name "S-510," manufactured by HITACHI Ltd.) Moreover, the content of the conductive particles was calculated from a particle volume, which was calculated assuming that the shape of the conductive particle is a sphere having a diameter of the average particle diameter, and an apparent density of the conductive particles.

Next, the paste-like conductive adhesive obtained as described above was applied on a glossy surface of an electrolytic copper foil (width 20 cm×length 30 cm×thickness 175 μm), which serves as the conductive substrate, using a roll coater (trade name "PI-1210," manufactured by TESTER SANGYO Co., Ltd.) to form a coating film on the conductive substrate. The gap of the roll coater was adjusted such that the thickness of the coating film after the solvent etc. was evaporated therefrom, that is, the thickness of the conductive adhesive layer, was 25 μm. This adjustment was performed based on a relational expression between the gap and the film thickness, which was derived in advance by fabricating three kinds of films, which each had a different film thickness after the removal of the solvent, by varying the gap.

Next, a conductive substrate on which a coating film had been formed was placed on a hot plate and was heated at 70° C. for 3 minutes so that solvents etc. were evaporated. Thereafter, the laminate was cut into 2 mm width with a slitter (trade name "High Precision Gang Unit," manufactured by Toyo Knife Co., Ltd.) to obtain a wiring member, in which a conductive adhesive layer (thickness 25 μm) dispersed with conductive particles was provided on the strip-like conductive substrate. This wiring member was further cut into 26 cm length to fabricate a rectangular wiring member of a 2 mm width×26 cm length.

Next, four of the aforementioned wiring members were prepared and respectively disposed so that the conductive adhesive layer on one end portion of the wiring member is overlapped on each bus-bar electrode and the back-face electrode of one solar battery cell, and thereafter heating and pressurizing were carried out by using a pressure bonding tool (trade name "AC-S300," manufactured by Nikka Equipment & Engineering Co., Ltd.) under the conditions of a heating temperature of 170° C., a pressurizing pressure of 2 MPa, and a heating/pressurizing time of 20 seconds. Thus, four wiring members were respectively bonded to both the front-end and back-face electrodes of the solar battery cell.

Next, the non-bonded portions of the two wiring members bonded to the front-face electrodes were turned around the central axis along the longitudinal direction so that the conductive adhesive layer surface of the non-bonded portion was opposite in orientation to the conductive adhesive layer surface which had been bonded. Another solar battery cell was disposed adjacently so that the back-face electrodes were overlapped respectively on the conductive adhesive layers of the turned-around wiring members, and newly prepared two wiring members were disposed such that the conductive adhesive layer on the one end portion was overlapped on the bus-bar electrodes of another solar battery cell. This was heated/pressurized under the same conditions as described above to fabricate a solar battery module including two solar battery cells connected in series as shown in FIG. 8.

Example 2

A paste-like conductive adhesive obtained in the same manner as in Example 1 was applied onto a PET film, which was dried under the same conditions as with Example 1 to obtain a film-like conductive adhesive, which was laminated on a conductive substrate (trade name "A-SNO," a tinned type, width 2 mm×length 260 mm×thickness 240 μm, manufactured by Hitachi Cable Ltd.) to fabricate a wiring member. Then, in the same manner as with Example 1 excepting that the foregoing wiring member was used, a solar battery module including two solar battery cells connected in series was fabricated.

Example 3

A wiring member was fabricated in the same manner as in Example 1 excepting that conductive particles were not added to the resin composition. Then, a solar battery module including two solar battery cells connected in series was fabricated in the same manner in Example 1 excepting that the forgoing wiring member was used.

Comparative Example 1

A solar battery module including two solar battery cells connected in series was fabricated in the same manner in Example 1 excepting that a solder-plated wire (trade name "A-TPS," manufactured by Hitachi Cable Ltd.) was used as the wiring member, the turning around of the wiring member was not conducted, and at the time of connection, the wiring member and the electrode were heated to be melt at 260° C. for 30 seconds by a lamp heater.

<Evaluation of Each Property of Solar Battery Module>

The solar battery modules obtained in Examples 1 to 3 and Comparative Example 1 were evaluated for yield, cell warpage, and reliability based on the following method. Results are shown in Table 1.

[Yield]

Ten units of solar battery modules of two series connection were fabricated, and the state of connection structure was observed for each unit so that a proportion (%) of the number of units, in which neither fracture nor peeling was recognized, in the 10 units was determined as the yield.

[Warpage of Cell]

The obtained solar battery module was placed on a smooth surface with the front-face electrode facing downward, and one end of a rectangular cell was fixed to the smooth surface. Since the cell had a convex shape on the side of the front-face electrode, fixing the one end of the rectangular cell resulted in a state that the opposing end was raised. The distance between the raised end and the smooth surface was measured at 5 points using a focal depth meter to calculate an arithmetic mean. A proportion (%) of the aforementioned arithmetic mean with respect to the one side length of the cell was calculated as a warpage amount. It is noted that since the value of lower measurement limit was 0.3%, when a measurement was smaller than that, it was designated as "<0.3" in the Table.

[Measurement of Reliability: FF(1000h)/FF(0h)]

IV curves of the obtained solar battery modules were measured by using a solar simulator (trade name "WXS-155S-10," AM: 1.5G, manufactured by WACOM ELECTRIC CO., Ltd.) Further, after the solar battery modules were allowed to stand still under a high temperature and high humidity atmosphere of 85° C. and 85% RH for 1000 hours, IV curves were measured in the same manner. FF was derived from each IV curve respectively, and FF(1000h)/FF(0h) value, which is obtained by dividing the FF after standing under the high temperature and high humidity atmosphere by the FF before standing in the high temperature and high humidity atmosphere, was used as the evaluation index. It is noted that when the value of FF(1000h)/FF(0h) becomes not more than 0.95, it is generally judged that the connection reliability is low.

<Evaluation of Productivity>

The productivity of the solar battery modules of Examples 1 to 3 and Comparative Example 1 were evaluated in view of facility investment and production process. The evaluations of the facility investment are indicated in Table 1 by [Existing Facility], [Low], [Middle], and [High] in the ascending order in facility cost. Further, the evaluations of the production process are indicated in Table 1 by [Simple], [Somewhat Complex], and [Rather Complex] in the order of production easiness.

TABLE 1

|  | Example 1 | Example 2 | Example 3 | Comparative Example 1 |
| --- | --- | --- | --- | --- |
| Yield (%) | 100 | 100 | 100 | 80 |
| Warpage of cell | <0.3 | <0.3 | <0.3 | 2.5 |
| Reliability (85° C., 85% RH) | 0.98 | 0.98 | 0.98 | 0.88 |
| Facility Investment | Low | Low | Low | Existing Facility |
| Production Process | Simple | Simple | Simple | Simple |

INDUSTRIAL APPLICABILITY

According to the present invention, it is possible to provide a method of connecting solar battery cells, which enables to simplify the production process as well as to obtain high reliability solar battery modules at a good yield, and a high reliability solar battery module.

The invention claimed is:

1. A method of connecting solar battery cells that are each provided with a front-face electrode on a front face thereof and a back-face electrode on a back face thereof, wherein the method comprises the steps of:
   (a) preparing a wiring member having first and second end portions, including a strip-like conductive substrate and an adhesive layer provided on one face of the conductive substrate, and bonding the adhesive layer on the first end portion of the wiring member with one of a front-face electrode or with a back-face electrode of one solar battery cell, wherein the adhesive layer comprises a resin composition that includes thermosetting resin;
   (b) turning the second end portion of the wiring member, having gone through step (a), one time around a central axis along a longitudinal direction of the wiring member so a turned-around part is disposed between the first end portion and the second end portion so that an adhesive layer surface of the second end portion is opposite in orientation to an adhesive layer surface of the first end portion; and
   (c) bonding the adhesive layer of the second end portion of the wiring member, having gone through step (b), with an electrode of a second solar battery cell having an opposite polarity to the electrode of the one solar battery cell that has been bonded in step (a) so that the first and second end portions of the wiring member are disposed along a straight line defined by the central axis of the wiring member.

2. The method of connecting solar battery cells according to claim 1, wherein the conductive substrate includes one or more metal elements selected from the group consisting of Cu, Ag, Au, Fe, Ni, Pb, Zn, Co, Ti and Mg.

3. The method of connecting solar battery cells according to claim 1, wherein the adhesive layer is a conductive adhesive layer.

4. The method of connecting solar battery cells according to claim 2, wherein the adhesive layer is a conductive adhesive layer.

5. A method of connecting solar battery cells that are each provided with a front-face electrode on a front face thereof and a back-face electrode on a back face thereof, wherein the method comprises the steps of:
   (a) preparing a turned-around wiring member by turning a first end portion of a wiring member having first and second end portions and including a strip-like conductive substrate, and an adhesive layer provided on one face of the conductive substrate, one time around a central axis along a longitudinal direction of the wiring member so a turned-around part is disposed between the first end portion and the second end portion of the wiring member so that an adhesive layer surface of the second end portion is opposite in orientation to an adhesive layer surface of the first end portion, and bonding the adhesive layer on the first end portion of the turned-around wiring member with a front-face electrode or with a back-face electrode of one solar battery cell, wherein the adhesive layer comprises a resin composition that includes thermosetting resin; and
   (b) bonding the adhesive layer of the second end portion of the turned-around wiring member with an electrode of a second solar battery cell having an opposite polarity to the electrode of the one solar battery cell that has been bonded in step (a) so that the first and second end portions of the wiring member are disposed along a straight line defined by the central axis of the wiring member.

6. The method of connecting solar battery cells according to claim 5, wherein the conductive substrate includes one or more metal elements selected from the group consisting of Cu, Ag, Au, Fe, Ni, Pb, Zn, Co, Ti and Mg.

7. The method of connecting solar battery cells according to claim 5, wherein the adhesive layer is a conductive adhesive layer.

8. A method of connecting solar battery cells that are each provided with a front-face electrode on a front face thereof and a back-face electrode on a back face thereof, wherein the method comprises the steps of:
(a) preparing a wiring member having first and second end portions and including a strip-like conductive substrate and an adhesive layer provided on one face of the conductive substrate, and bonding the adhesive layer on first end portion of the wiring member with a front-face electrode or with a back-face electrode of one solar battery cell, wherein the adhesive layer comprises a resin composition that includes thermosetting resin;
(b) turning the second end portion of the wiring member, having gone through step (a), only one time around a central axis along a longitudinal direction of the wiring member so that an adhesive layer surface of the second end portion is opposite in orientation to an adhesive layer surface of the one end portion; and
(c) bonding the adhesive layer of the second end portion of the wiring member, having gone through step (b), with an electrode of a second solar battery cell having an opposite polarity to the electrode of the one solar battery cell that has been bonded in step (a) so that the first and second end portions of the wiring member are disposed along a straight line defined by the central axis of the wiring member.

9. A method of connecting solar battery cells that are each provided with a front-face electrode on a front face thereof and a back-face electrode on a back face thereof, wherein the method comprises the steps of:
(a) preparing a turned-around wiring member by turning a first end portion of a wiring member having first and second end portions and including a strip-like conductive substrate, and an adhesive layer provided on one face of the conductive substrate, only one time around a central axis along a longitudinal direction of the wiring member so that an adhesive layer surface of the second end portion of the wiring member is opposite in orientation to an adhesive layer surface of the one end portion, and bonding the adhesive layer on the first end portion of the turned-around wiring member with a front-face electrode or with a back-face electrode of one solar battery cell, wherein the adhesive layer comprises a resin composition that includes thermosetting resin; and
(b) bonding the adhesive layer of the second end portion of the turned-around wiring member with an electrode of a second solar battery cell having an opposite polarity to the electrode of the one solar battery cell that has been bonded in step (a) so that the first and second end portions of the wiring member are disposed along a straight line defined by the central axis of the wiring member.

10. A method of connecting solar battery cells that are each provided with a front-face electrode on a front face thereof and a back-face electrode on a back face thereof, wherein the method comprise the steps of:
(a2) preparing a turned-around wiring member by turning a first end portion of a wiring member having first and second end portions and including a strip-like conductive substrate, and an adhesive layer provided on one face of the conductive substrate, one time around a central axis along a longitudinal direction of the wiring member so a turned-around part is disposed between the first end portion and the second end portion is opposite in orientation to an adhesive layer surface of the first end portion; and
(b2) bonding the adhesive layer on the first end portion of the turned-around wiring member with a front-face electrode or with a back-face electrode of one solar battery cell, wherein the adhesive layer comprises a resin composition that includes thermosetting resin, while bonding the adhesive layer of the second end portion of the turned-around wiring member with an electrode of a second solar battery cell having an opposite polarity to the electrode of the one solar battery cell so that the first and second end portions of the wiring member are disposed along a straight line defined by the central axis of the wiring member.

11. The method of connecting solar battery cells according to claim 10, wherein the conductive substrate includes one or more metal elements selected from the group consisting of Cu, Ag, Au, Fe, Ni, Pb, Zn, Co, Ti and Mg.

12. The method of connecting solar battery cells according to claim 10, wherein the adhesive layer is a conductive adhesive layer.

13. A method of connecting solar battery cells that are each provided with a front-face electrode on a front face thereof and a back-face electrode on a back face thereof, wherein the method comprise the steps of:
(a2) preparing a turned-around wiring member by turning a first end portion of a wiring member having first and second end portions and including a strip-like conductive substrate, and an adhesive layer provided on one face of the conductive substrate, only one time around a central axis along a longitudinal direction of the wiring member so a turned-around part is disposed between the first end portion and the second end portion is opposite in orientation to an adhesive layer surface of the first end portion; and
(b2) bonding the adhesive layer on the first end portion of the turned-around wiring member with a front-face electrode or with a back-face electrode of one solar battery cell, wherein the adhesive layer comprises a resin composition that includes thermosetting resin, while bonding the adhesive layer of the second end portion of the turned-around wiring member with an electrode of a second solar battery cell having an opposite polarity to the electrode of the one solar battery cell so that the first and second end portions of the wiring member are disposed along a straight line defined by the central axis of the wiring member.

14. The method of connecting solar battery cells according to claim 13, wherein the conductive substrate includes one or more metal elements selected from the group consisting of Cu, Ag, Au, Fe, Ni, Pb, Zn, Co, Ti and Mg.

15. The method of connecting solar battery cells according to claim 13, wherein the adhesive layer is a conductive adhesive layer.

* * * * *